(12) United States Patent
Wang et al.

(10) Patent No.: US 11,143,623 B2
(45) Date of Patent: Oct. 12, 2021

(54) PREPARATION PROCESS FOR GRAPHENE RESONANT GAS SENSOR BASED ON DOPED METAL ATOMS

(71) Applicant: Jiangsu University, Jiangsu (CN)

(72) Inventors: Quan Wang, Jiangsu (CN); Jiangtao Wang, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 16/982,057

(22) PCT Filed: Apr. 28, 2020

(86) PCT No.: PCT/CN2020/087577
§ 371 (c)(1),
(2) Date: Sep. 18, 2020

(87) PCT Pub. No.: WO2021/027330
PCT Pub. Date: Feb. 18, 2021

(65) Prior Publication Data
US 2021/0262984 A1 Aug. 26, 2021

(30) Foreign Application Priority Data
Aug. 14, 2019 (CN) .......................... 201910749000.4

(51) Int. Cl.
*G01N 29/00* (2006.01)
*G01N 29/02* (2006.01)
(Continued)

(52) U.S. Cl.
CPC ......... *G01N 29/022* (2013.01); *G01N 29/036* (2013.01); *H03H 3/007* (2013.01); *G01N 2291/014* (2013.01); *G01N 2291/021* (2013.01)

(58) Field of Classification Search
CPC ..... G01N 29/022; G01N 29/036; H03H 3/007
See application file for complete search history.

(56) References Cited

U.S. PATENT DOCUMENTS

| | | | |
|---|---|---|---|
| 2010/0070197 A1* | 3/2010 | Wang ..................... | G01N 21/65 702/22 |
| 2013/0236786 A1* | 9/2013 | Zhou ..................... | H01B 13/34 429/217 |

(Continued)

FOREIGN PATENT DOCUMENTS

| | | |
|---|---|---|
| CN | 103296991 | 9/2013 |
| CN | 104038173 | 9/2014 |

(Continued)

OTHER PUBLICATIONS

"International Search Report (Form PCT/ISA/210) of PCT/CN2020/087577," dated Jun. 28, 2020, pp. 1-5.

(Continued)

*Primary Examiner* — Francis C Gray
(74) *Attorney, Agent, or Firm* — JCIP Global Inc.

(57) ABSTRACT

The present disclosure belongs to the technical field of sensors, relates to a graphene resonant gas sensor, and in particular, to a graphene resonant gas sensor based on doped metal atoms and a preparation process therefor. In the present disclosure, the metal atoms are embedded in a graphene resonant beam, and a transition metal layer may use the doped metal atoms as anchor points to be tightly adsorbed to the surface of the graphene resonant beam, so that the quality of surface contact between the transition metal layer and the graphene resonant beam is improved, and the problems such as low quality and low sensitivity of conventional resonant gas sensors are effectively solved.

17 Claims, 9 Drawing Sheets

(51) Int. Cl.
    *G01N 29/036*    (2006.01)
    *H03H 3/007*     (2006.01)

(56) References Cited

U.S. PATENT DOCUMENTS

| | | | | |
|---|---|---|---|---|
| 2014/0061486 | A1* | 3/2014 | Bao | G02B 1/02 |
| | | | | 250/370.01 |
| 2017/0296771 | A1* | 10/2017 | Scharmer | A61M 16/1075 |
| 2018/0017516 | A1* | 1/2018 | Dobrokhotov | H01L 29/24 |
| 2018/0134902 | A1* | 5/2018 | Wu | C01B 32/194 |
| 2019/0355868 | A1* | 11/2019 | Fimland | H01L 21/02444 |

FOREIGN PATENT DOCUMENTS

| | | |
|---|---|---|
| CN | 104854789 | 8/2015 |
| CN | 104076199 | 4/2017 |
| CN | 110018205 | 7/2019 |
| CN | 110530969 | 12/2019 |
| WO | 2015092570 | 6/2015 |

OTHER PUBLICATIONS

Tao Wang, et al., "A Review on Graphene-Based Gas/Vapor Sensors with Unique Properties and Potential Applications," Nano-Micro Lett., vol. 8, Nov. 2015, pp. 95-119.

\* cited by examiner

PREPARATION PROCESS FOR GRAPHENE RESONANT GAS SENSOR BASED ON DOPED METAL ATOMS

CROSS-REFERENCE TO RELATED APPLICATION

This application is a 371 of international application of PCT application serial no. PCT/CN2020/087577, filed on Apr. 28, 2020, which claims the priority benefit of China application no. 201910749000.4, filed on Aug. 14, 2019. The entirety of each of the above mentioned patent applications is hereby incorporated by reference herein and made a part of this specification.

BACKGROUND

Technical Field

The present disclosure belongs to the technical field of sensors, relates to a graphene resonant gas sensor, and in particular, to a graphene resonant gas sensor based on doped metal atoms and a preparation process therefor.

Description of Related Art

Graphene is a novel two-dimensional material having unique physical properties, including Young's modulus, tensile strength, thermal conductivity, electron mobility, and huge specific surface area, and has a wide application prospect in the preparation of gas sensors. Since carbon atoms in a graphene layer are bonded by $sp^2$ hybridization, the chemical activity is not high. Conventional gas detection instruments have huge sizes and high prices, and the development of NEMS technologies opens up a new development space for gas sensors. Conventional resonant gas sensors are all secondary sensitive, where a layer of sensitive substance is spin-coated on a resonant beam, and specific gas molecules are adsorbed on the resonant beam to change the mass of the beam, leading in turn to a change in the inherent resonant frequency of the resonant beam. Under normal circumstances, a transition metal layer and a graphene resonant beam are in surface contact and adsorbed to each other by van der Waals force, so that problems such as poor contact and easy fall-off exist, and thus graphene resonant gas sensors also have problems such as low quality and low sensitivity.

SUMMARY

The objective of the present disclosure is, in view of the problems such as low quality and low sensitivity of conventional resonant gas sensors, to provide a graphene resonant gas sensor based on doped metal atoms and a preparation process therefor.

The present disclosure is implemented through the technical solution consisting of the following technical measures.

A preparation process for a graphene resonant gas sensor based on doped metal atoms provided in the present disclosure comprises the following steps:

step 1: depositing a $SiO_2$ dielectric layer on a Si substrate by a chemical vapor deposition (CVD) method, and then performing a ultrasonic cleaning on the $SiO_2$ dielectric layer by using absolute ethanol and deionized water;

step 2: spin-coating a direct writing glue PPA on a surface of the $SiO_2$ dielectric layer, and etching three rectangular grooves in the PPA by using a direct writing machine having a nano 3D structure; first depositing a layer of Ti and then depositing a layer of Au—Pt alloy material in each of the rectangular grooves by using an electron beam evaporation (EBE) technique, and upon completion of the deposition, removing remaining PPA by using the direct writing machine having the nano 3D structure, wherein obtained metal blocks serve as a source metal electrode, a gate metal electrode, and a drain metal electrode in turn;

step 3: cutting away a part of the gate metal electrode by using a focused ion beam (FIB), so that a height difference is generated between the gate metal electrode and the source metal electrode and the drain metal electrode;

step 4: preparing a single-layer graphene film by using a mechanical exfoliation method, preparing n C-atom vacancies step by step in the graphene film by using a transmission electron microscope (TEM), wherein the C-atom vacancies should be located in a range having a diameter of 10 to 20 nm from a center of the graphene film, spin-coating the PPA on a surface of the graphene film, etching a circular through-hole in the PPA by using the direct writing machine having the nano 3D structure, wherein the through-hole is located above the C-atom vacancies, depositing a metal material in the circular through-hole by EBE to serve as a transition layer metal, removing remaining PPA by using the direct writing machine having the nano 3D structure, and finally cutting out a required size of a graphene resonant beam through an FIB, so that the deposited transition layer metal is located at a central position of the graphene resonant beam;

step 5: transferring the graphene resonant beam obtained in step 4 to a place above the source metal electrode and the drain metal electrode by a wet transfer method;

step 6: modifying a polymer coating on the transition layer metal of the graphene resonant beam to obtain a graphene resonant gas sensor based on doped metal atoms.

In step 1, a thickness of the deposited $SiO_2$ dielectric layer is 100 nm; an ultrasonic power in the ultrasonic cleaning is 30 to 45 W, and a cleaning time is 3 to 5 minutes.

In step 2, a type of the PPA is poly(phthalaldehyde) and a viscosity is 5 cp, a rotation speed of a spin-coater in the spin-coating is 1000 to 2000 r/min, a spin-coating time is 30 s, and a final effect achieved is: a thickness of the PPA is 1000 nm.

In step 2, for the three rectangular grooves, depths of the three grooves are all 1000 nm; lengths of grooves on two sides are both 1000 nm, and widths of grooves on two sides are both 1000 nm; a length of a middle groove is 1000 nm, and a width of the middle groove is 500 nm; the grooves on two sides are symmetrical about the middle groove; a distance between adjacent edges of a groove on one side and the middle groove is 500 to 1000 nm; a height of the obtained metal blocks is 1000 nm, wherein a thickness of Ti is 200 nm, and a thickness of the Au—Pt alloy material is 800 nm.

In step 3, a height of the gate metal electrode that is cut away is 400 to 600 nm.

In step 4, a size of the single-layer graphene film should be greater than or equal to 10 μm×10 μm; an electron beam diameter of the TEM needs to be set to be less than or equal to 1 Å, and n=50 to 100; a viscosity of the PPA is 3 cp, a rotation speed of the spin-coater is 3000 to 7000 r/min, a spin-coating time is 30 s, and a final effect achieved is: a thickness of the PPA is 100 nm; a diameter of the circular through-hole is a distribution range of the C-atom vacancies; the transition layer metal is an Au or Pt material, and has a thickness of 100 nm; and a length of the graphene resonant beam is 3000 to 4500 nm, and a width of the graphene resonant beam is 500 nm.

In step 5, the transition layer metal on the graphene resonant beam should be located directly above the gate metal electrode and in a suspended state.

In step 6, the polymer coating is polystyrene.

The graphene resonant gas sensor based on doped metal atoms prepared in the present disclosure is used in gas detection, namely, used in acetone detection.

Beneficial effects of the present disclosure are as follows:

The present solution provides a graphene resonant gas sensor based on doped metal atoms. As compared with direct deposition of a transition metal layer and a layer of sensitive substance on a graphene resonant beam, metal atoms are doped in the graphene film to serve as anchor points of the transition metal layer, so that problems such as low quality and low sensitivity of the graphene resonant gas sensor can be solved.

In the figures: 1—Si substrate; 2—$SiO_2$ dielectric layer; 3—PPA; 4—source metal electrode; 5—gate metal electrode; 6—drain metal electrode; 7—graphene film; 8—graphene resonant beam; 9—transition layer metal; 10—polymer coating.

DESCRIPTION OF THE EMBODIMENTS

The substantive features and notable progress of the present disclosure are further illustrated below through specific implementations, but the present disclosure is definitely not just limited to the described embodiments.

Embodiment 1

Figure 1:
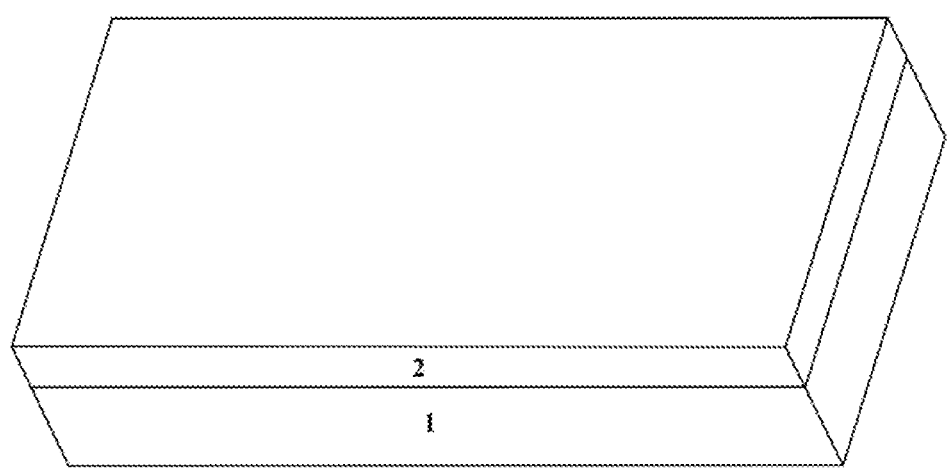
FIG. 1 is a schematic structural view of depositing a $SiO_2$ dielectric layer on a Si substrate.

Specific implementation steps are as follows:

Step 1: a $SiO_2$ dielectric layer 2 having a thickness of 100 nm is deposited on a Si substrate 1 by a CVD method, as shown in FIG. 1. Then, a ultrasonic cleaning is performed on the $SiO_2$ dielectric layer 2 by using absolute ethanol and deionized water, where the ultrasonic power is 30 to 45 W, and the cleaning time is 3 to 5 minutes.

Figure 2:
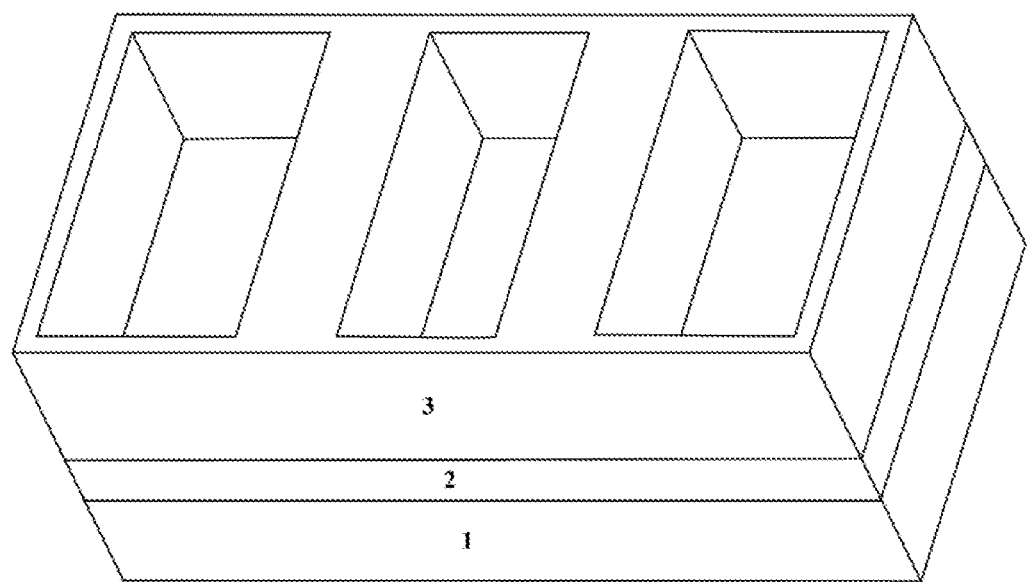
FIG. 2 is a schematic structural view of spin-coating a PPA on the $SiO_2$ dielectric layer.
Figure 3:
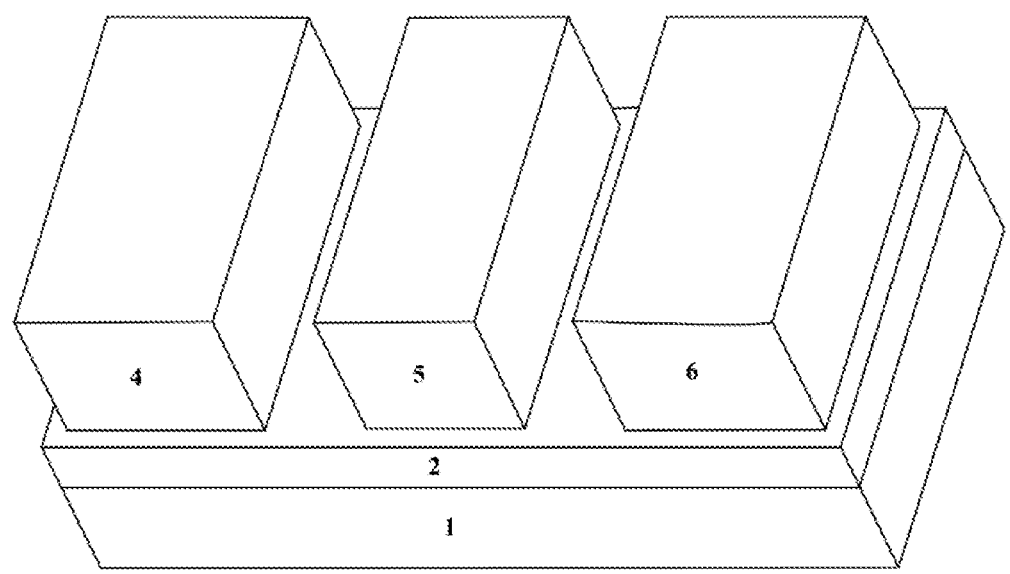
FIG. 3 is a schematic structural view of preparing a source metal electrode, a drain metal electrode, and a gate metal electrode.

Step 2: a PPA having a thickness of 1000 nm is spin-coated on the surface of the $SiO_2$ dielectric layer 2, where the type of the PPA is poly(phthalaldehyde), the viscosity of the PPA is 5 cp, the rotation speed of a spin-coater is 1000 to 2000 r/min, and the spin-coating time is 30 s. Three rectangular grooves are etched in the PPA by using a direct writing machine having a nano 3D structure, where for the three rectangular grooves, depths of the grooves are all 1000 nm; lengths of grooves on two sides are both 1000 nm, and widths of grooves on two sides are both 1000 nm; a length of a middle groove is 1000 nm, and a width of the middle groove is 500 nm; the grooves on two sides are symmetrical about the middle groove; a distance between adjacent edges of a groove on one side and the middle groove is 500 to 1000 nm, as shown in FIG. 2. First, a layer of Ti having a thickness of 200 nm is deposited and then a layer of Au—Pt alloy material having a thickness of 800 nm is deposited in each of the rectangular grooves by using an electron beam evaporation (EBE) technique, and upon completion of the deposition, remaining PPA is removed by using the direct writing machine having the nano 3D structure, where obtained metal blocks serve as a source metal electrode 4, a gate metal electrode 5, and a drain metal electrode 6 in turn, as shown in FIG. 3.

Figure 4:
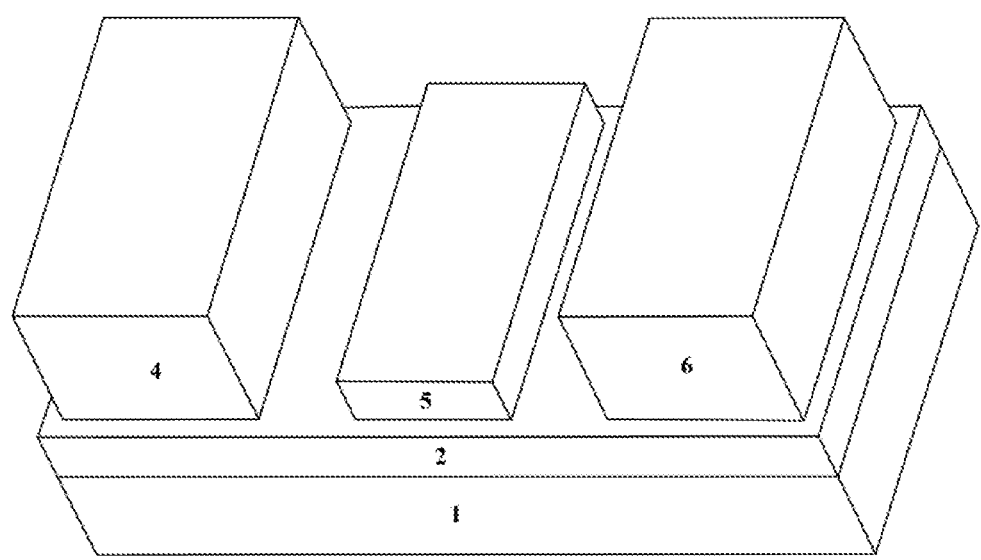
FIG. 4 is a schematic structural view of cutting the gate metal electrode.

Step 3: the gate metal electrode 5 having a height of 600 nm is cut away by using an FIB, and the retained gate metal electrode 5 has a height of 400 nm, so that a height difference is generated between the gate metal electrode 5 and the source metal electrode 4 and the drain metal electrode 6, as shown in FIG. 4.

Figure 5:
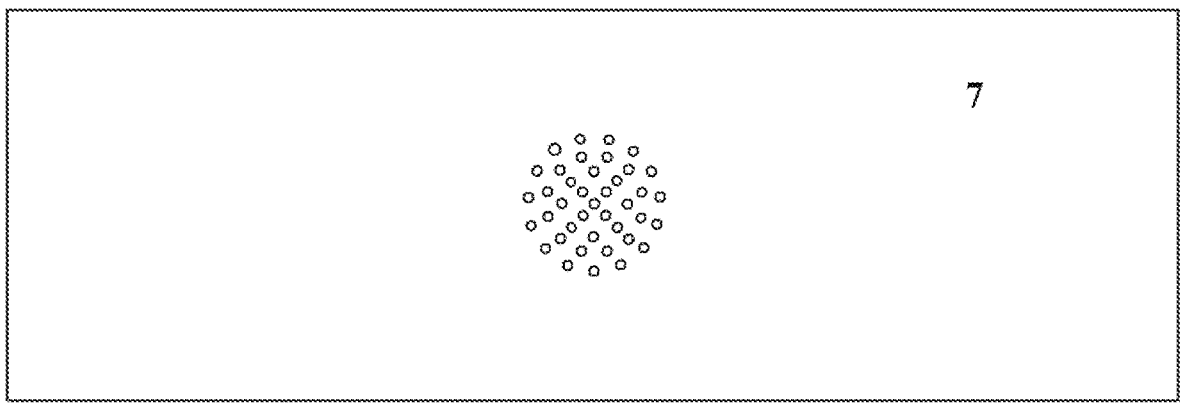
FIG. 5 is a schematic structural view of preparing C-atom vacancies on a graphene film.
Figure 6:
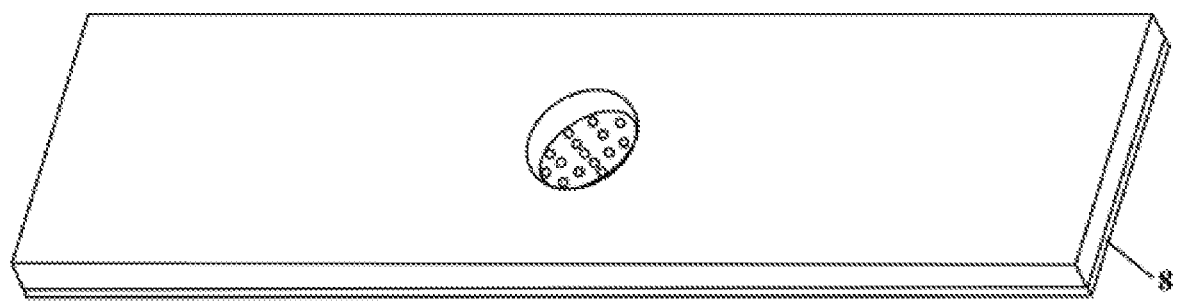
FIG. 6 is a schematic structural view of spin-coating a PPA on the graphene film.
Figure 7:
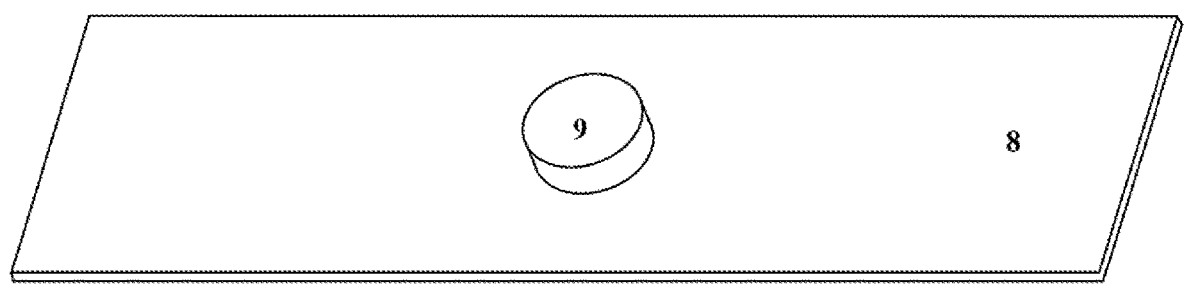
FIG. 7 is a schematic structural view of preparing a graphene resonant beam.

Step 4: a single-layer graphene film 7 having a size of 10 μm×10 μm is prepared by using a mechanical exfoliation method. An electron beam diameter of a TEM is set to 1 Å. 100 C-atom vacancies are prepared step by step in the middle position of the graphene film 7 by using the TEM, where the C-atom vacancies are located in a region having a diameter of 20 nm, as shown in FIG. 5. The PPA having a thickness of 100 nm is spin-coated on the surface of the graphene film 7, where the viscosity of the PPA is about 3 cp, the rotation speed of the spin-coater is 3000 to 7000 r/min, and the spin-coating time is 30 s. A circular through-hole is etched in the PPA by using the direct writing machine having the nano 3D structure, where the diameter of the circular through-hole is 20 nm, as shown in FIG. 6. A layer of Au material is deposited in the region of the circular through-hole by EBE to serve as a transition layer metal 9, and remaining PPA is removed by using the direct writing machine having the nano 3D structure. Finally, a required size of a graphene resonant beam 8 is cut out through an FIB, where the length of the graphene resonant beam 8 is 4500 nm, and the width of the graphene resonant beam 8 is 500 nm, and the deposited transition layer metal 9 is located at a central position of the graphene resonant beam 8, as shown in FIG. 7.

Figure 8:
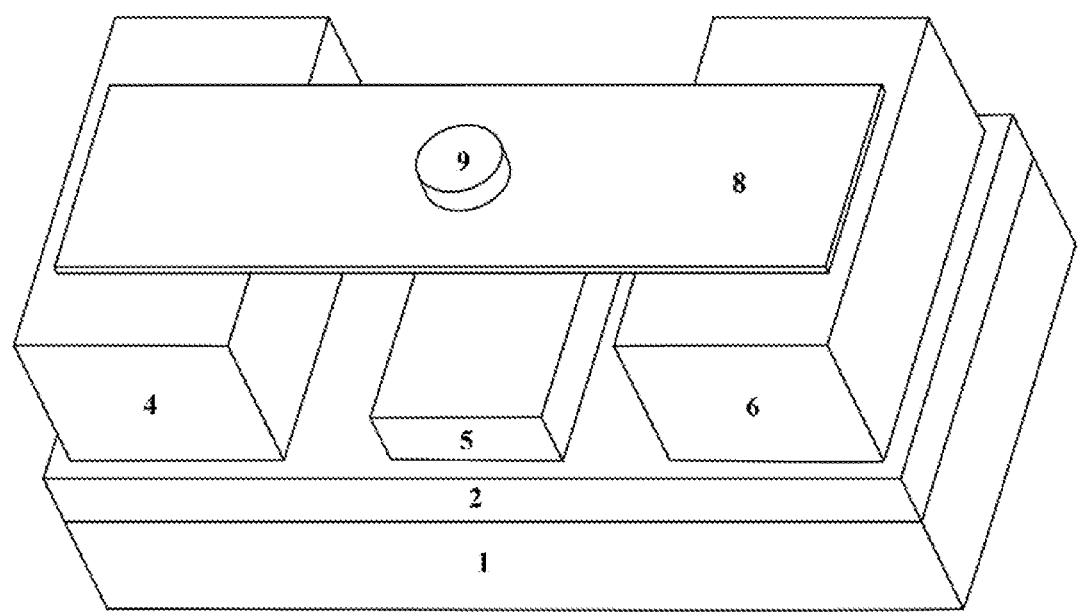
FIG. 8 is a schematic structural view of transferring the graphene resonant beam.

Step 5: the graphene resonant beam 8 is transferred to the surface of the source metal electrode 4 and the drain metal electrode 6 by a wet transfer method, so that the transition layer metal 9 on the graphene resonant beam 8 should be located directly above the source metal electrode 5 and is in a suspended state, as shown in FIG. 8.

Figure 9:
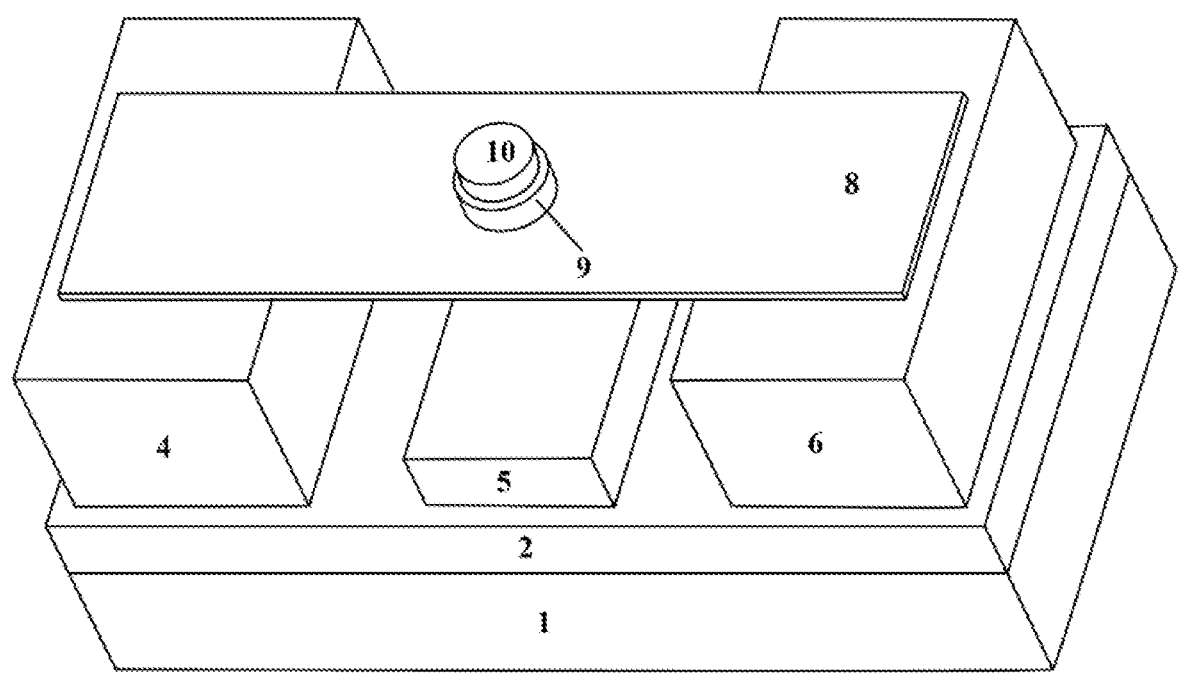
FIG. 9 is a schematic structural view of a graphene resonant gas sensor doped with metal atoms.

Step 6: in order to detect acetone gas, a polystyrene material is prepared on the transition layer metal 9 by a deposition method, as shown in FIG. 9. Finally, the preparation of a graphene resonant gas sensor used for detecting acetone gas is completed, as shown in FIG. 9.

Step 7: the variation in a resonant frequency in a target environment of the present disclosure is detected according to a method and device for detecting a resonant frequency provided in Patent No. CN 104076199 B, and finally the content of acetone gas in the environment is obtained.

First, the graphene resonant gas sensor is connected to an LLC circuit to determine a scanning range of 100 to 400 MHz, and then a voltage obtaining unit is used to obtain a voltage of the resonant gas sensor at different frequencies in the scanning range of 100 to 400 MHz, then a calculation and judgment unit is used to judge the voltage obtained by the voltage obtaining unit, and finally, a resonant frequency determining unit is used to determine a resonant frequency of the resonant gas sensor. Since the resonant gas sensor in the present disclosure has a linearly varying resonant frequency under standard voltage conditions, the content of the acetone gas can be judged through the value of the resonant frequency. The resonant frequency in a vacuum is 368.4 MHz, the resonant frequency in an environment filled with acetone gas is 196.5 MHz, and if the resonant frequency at this time detected in the environment is Q, the content of the acetone gas in the environment is:

$$\text{acetone }\% = \frac{368.4 - Q}{368.4 - 196.5} \times 100\% = \frac{368.4 - Q}{171.9} \times 100\%.$$

What is claimed is:

1. A preparation process for a graphene resonant gas sensor based on doped metal atoms, comprising the following steps:
    step 1: depositing a $SiO_2$ dielectric layer (2) on a Si substrate (1) by a chemical vapor deposition method, and then performing an ultrasonic cleaning on the $SiO_2$ dielectric layer by using absolute ethanol and deionized water;
    step 2: spin-coating a PPA (3) on a surface of the $SiO_2$ dielectric layer (2), and etching three rectangular grooves in the PPA (3) by using a direct writing machine having a nano 3D structure; first depositing a layer of Ti and then depositing a layer of Au—Pt alloy material in each of the rectangular grooves by using an electron beam evaporation technique, and upon completion of the deposition, removing remaining PPA (3) by using the direct writing machine having the nano 3D structure, wherein obtained metal blocks serve as a source metal electrode (4), a gate metal electrode (5), and a drain metal electrode (6) in turn;
    step 3: cutting away a part of the gate metal electrode (5) by using a focused ion beam, so that a height difference is generated between the gate metal electrode (5) and the source metal electrode (4) and the drain metal electrode (6);
    step 4: preparing a single-layer graphene film (7) by using a mechanical exfoliation method, preparing n C-atom vacancies step by step in the graphene film (7) by using a transmission electron microscope, wherein the C-atom vacancies are located in a range having a diameter of 10 to 20 nm from a center of the graphene film (7), spin-coating the PPA on a surface of the graphene film (7), etching a circular through-hole in the PPA by using the direct writing machine having the nano 3D structure, wherein the through-hole is located above the C-atom vacancies, depositing a metal material in the circular through-hole by EBE to serve as a transition layer metal (9), removing remaining PPA by using the direct writing machine having the nano 3D structure, and finally cutting out a required size of a graphene resonant beam (8) through the focused ion beam, so that the deposited transition layer metal (9) is located at a central position of the graphene resonant beam (8);
    step 5: transferring the graphene resonant beam (8) obtained in step 4 to a place above the source metal electrode (4) and the drain metal electrode (6) by a wet transfer method; and
    step 6: modifying a polymer coating (10) on the transition layer metal (9) of the graphene resonant beam (8) to obtain the graphene resonant gas sensor based on doped metal atoms.

2. The preparation process according to claim 1, wherein in step 1, a thickness of the deposited $SiO_2$ dielectric layer (2) is 100 nm; an ultrasonic power in the ultrasonic cleaning is 30 to 45 W, and a cleaning time is 3 to 5 minutes.

3. The preparation process according to claim 1, wherein in step 2, a type of the PPA (3) is poly(phthalaldehyde) and a viscosity is 5 cp, a rotation speed of a spin-coater in the spin-coating is 1000 to 2000 r/min, a spin-coating time is 30 s, and a final effect achieved is: a thickness of the PPA (3) is 1000 nm.

4. The preparation process according to claim 1, wherein in step 2, for the three rectangular grooves, depths of the three grooves are all 1000 nm; lengths of grooves on two sides are both 1000 nm, and widths of grooves on two sides are both 1000 nm; a length of a middle groove is 1000 nm, and a width of the middle groove is 500 nm; the grooves on two sides are symmetrical about the middle groove; a distance between adjacent edges of a groove on one side and the middle groove is 500 to 1000 nm; a height of the obtained metal blocks is 1000 nm, wherein a thickness of Ti is 200 nm, and a thickness of the Au—Pt alloy material is 800 nm.

5. The preparation process according to claim 1, wherein in step 3, a height of the gate metal electrode (5) that is cut away is 400 to 600 nm.

6. The preparation process according to claim 1, wherein in step 4, a size of the single-layer graphene film (7) is greater than or equal to 10 μm×10 μm; an electron beam diameter of the transmission electron microscope is set to be less than or equal to 1 Å, and n=50 to 100; a viscosity of the PPA is 3 cp, a rotation speed of the spin-coater is 3000 to 7000 r/min, a spin-coating time is 30 s, and a final effect achieved is: a thickness of the PPA is 100 nm; a diameter of the circular through-hole is a distribution range of the C-atom vacancies; the transition layer metal (9) is an Au or Pt material, and has a thickness of 100 nm; and a length of the graphene resonant beam (8) is 3000 to 4500 nm, and a width of the graphene resonant beam (8) is 500 nm.

7. The preparation process according to claim 1, wherein in step 5, the transition layer metal (9) on the graphene resonant beam (8) is located directly above the gate metal electrode (5) and in a suspended state.

8. The preparation process according to claim 1, wherein in step 6, the polymer coating (10) is polystyrene.

9. Use of the graphene resonant gas sensor based on the doped metal atoms prepared by the preparation process according to claim 1 for gas detection.

10. The use according to claim 9, used for acetone detection.

11. Use of the graphene resonant gas sensor based on the doped metal atoms prepared by the preparation process according to claim 2 for gas detection.

12. Use of the graphene resonant gas sensor based on the doped metal atoms prepared by the preparation process according to claim 3 for gas detection.

13. Use of the graphene resonant gas sensor based on the doped metal atoms prepared by the preparation process according to claim 4 for gas detection.

14. Use of the graphene resonant gas sensor based on the doped metal atoms prepared by the preparation process according to claim 5 for gas detection.

15. Use of the graphene resonant gas sensor based on the doped metal atoms prepared by the preparation process according to claim 6 for gas detection.

16. Use of the graphene resonant gas sensor based on the doped metal atoms prepared by the preparation process according to claim 7 for gas detection.

17. Use of the graphene resonant gas sensor based on the doped metal atoms prepared by the preparation process according to claim 8 for gas detection.

* * * * *